(12) United States Patent
Bjorkman et al.

(10) Patent No.: US 10,305,577 B2
(45) Date of Patent: May 28, 2019

(54) MULTI-STAGE LINEARIZER

(71) Applicant: Lockheed Martin Corporation, Bethesda, MD (US)

(72) Inventors: Marc Ronald Bjorkman, Highlands Ranch, CO (US); Kim Thomas Lancaster, New Hope, PA (US); Douglas V. McKinnon, Littleton, CO (US); Novellone Rozario, Trenton, NJ (US); Jason Michael Teixeira, Swedesboro, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 14/832,982

(22) Filed: Aug. 21, 2015

(65) Prior Publication Data

US 2016/0056881 A1    Feb. 25, 2016

Related U.S. Application Data (60) Provisional application No. 62/040,999, filed on Aug. 22, 2014.

(51) Int. Cl.
| | |
|---|---|
| *H04B 7/185* | (2006.01) |
| *H03F 1/32* | (2006.01) |
| *H03F 3/195* | (2006.01) |
| *H03F 3/24* | (2006.01) |
| *H04B 1/04* | (2006.01) |

(52) U.S. Cl.
CPC ......... *H04B 7/1851* (2013.01); *H03F 1/3241* (2013.01); *H03F 1/3276* (2013.01); *H03F 3/195* (2013.01); *H03F 3/245* (2013.01); *H04B 1/0475* (2013.01); *H03F 2200/405* (2013.01); *H03F 2200/451* (2013.01); *H04B 2001/0425* (2013.01)

(58) Field of Classification Search
CPC ............ H03F 2200/451; H03F 1/3241; H04L 27/367; H04B 7/1851
See application file for complete search history.

(56) References Cited

U.S. PATENT DOCUMENTS

| | | | | |
|---|---|---|---|---|
| 5,221,908 | A * | 6/1993 | Katz | H03F 1/3241 330/149 |
| 6,252,912 | B1 * | 6/2001 | Salinger | H03F 1/3247 375/278 |
| 6,310,517 | B1 * | 10/2001 | Nakahara | H03F 3/1935 330/277 |
| 6,346,853 | B1 * | 2/2002 | Kangaslahti | H04B 1/62 330/149 |

(Continued)

*Primary Examiner* — Jean B Corrielus
(74) *Attorney, Agent, or Firm* — Morgan, Lewis & Bockius LLP (57) ABSTRACT

A high-linearity linearizer system includes a multi-stage linearizer circuit formed by cascading multiple linearizer circuits. The multi-stage linearizer circuit is configured to pre-distort an input signal to generate a pre-distorted signal. A non-linear high-power amplifier (HPA) having non-linear characteristics is coupled to the multi-stage linearizer circuit and is configured to amplify the pre-distorted signal. Pre-distortion characteristics of the multi-stage linearizer circuit are configured to counter the non-linear characteristics of the non-linear HPA and to compensate a non-linearity of the non-linear HPA to achieve a desired level of linearity.

18 Claims, 11 Drawing Sheets

(56) References Cited

U.S. PATENT DOCUMENTS

| | | | | |
|---|---|---|---|---|
| 7,196,576 B2* | 3/2007 | Mizuta | ............... | H03F 1/3247 |
| | | | | 330/151 |
| 7,332,961 B2* | 2/2008 | Blednov | ............... | H03F 1/3241 |
| | | | | 330/124 R |
| 7,348,843 B1* | 3/2008 | Qiu | ............... | H03F 1/3241 |
| | | | | 330/149 |
| 8,008,988 B1* | 8/2011 | Yang | ............... | H03K 17/693 |
| | | | | 333/101 |
| 8,587,378 B2* | 11/2013 | Khandavalli | ............... | H03F 1/3241 |
| | | | | 330/109 |
| 8,779,857 B2* | 7/2014 | Pletcher | ............... | H03F 1/086 |
| | | | | 330/302 |
| 9,160,310 B2* | 10/2015 | Velazquez | ............... | H04L 27/265 |
| 2001/0017556 A1* | 8/2001 | Tokumitsu | ............... | H03B 19/00 |
| | | | | 327/119 |
| 2004/0183583 A1* | 9/2004 | Mizuno | ............... | H01P 1/15 |
| | | | | 327/389 |
| 2007/0241812 A1* | 10/2007 | Yang | ............... | H03F 1/3247 |
| | | | | 330/75 |
| 2008/0238569 A1* | 10/2008 | Matsuo | ............... | H03H 7/40 |
| | | | | 333/32 |
| 2013/0005283 A1* | 1/2013 | van Zelm | ............... | H03F 1/3247 |
| | | | | 455/114.3 |

* cited by examiner

MULTI-STAGE LINEARIZER

CROSS-REFERENCE TO RELATED APPLICATIONS

This application claims the benefit of priority under 35 U.S.C. § 119 from U.S. Provisional Patent Application 62/040,999 filed Aug. 22, 2014, which is incorporated herein by reference in its entirety.

STATEMENT REGARDING FEDERALLY SPONSORED RESEARCH OR DEVELOPMENT

Not applicable

FIELD OF THE INVENTION

The present invention generally relates to linearizers, and more particularly, to high-linearity multi-stage linearizer.

BACKGROUND

Performance of communications systems is driven by many factors that relate to either signal fidelity or signal-to-noise ratio (SNR). Fidelity relates to the faithful reproduction of the shape of the signal. SNR relates to the noise and interference levels in the system that transmits the signal. Designers and operators of communications systems that include an element that repeats the signal, such as a satellite transponder, strive to minimize the degradations to fidelity and SNR that occur in the transmission system. One parameter of a communications system, among others, that characterizes degradation is linearity. Linearity is typically most affected by the amplifiers in a communications system, particularly the final amplifier in the systems, also known as the high-power amplifier (HPA). HPAs in satellite systems are typically either solid state power amplifiers (SSPAs) or travelling-wave tube amplifiers (TWTAs).

In linear communications systems, the output signal (y) is linearly proportional to the input signal (x), related by only a multiplier (e.g., an amplification factor, a) and a constant (e.g., a bias, b). A plot of the output signal versus the input signal would produce a straight line (e.g., y=ax+b). Actual and practical communication systems amplifiers are typically linear over a limited range of input signal levels. For example, in the amplitude transfer function graph that has input signal level on the horizontal axis and output signal level on the vertical axis, as the input signal increases past this linear region, the output signal starts to compress (e.g., have reduced amplification) and will typically saturate (e.g., reach a level in which the output no longer increases as the input level increases). Similar linearity issues affect the phase response of an amplifier as well.

While practical amplifiers cannot avoid this non-linear behavior, users and designers of communications systems strive to minimize the extent of the non-linear region of the amplitude and phase transfer functions, attempting to match the performance of a practical ideal amplifier, which is perfectly linear until saturation is reached. In a typical application, a target linearity for a particular type of communications signal is determined, and then the amplifier is backed-off (e.g., input signal is moved lower than saturation) to an operating point that enables amplifier linearity performance to match requirements. A more linear system allows the system to be backed-off less, therefore, enabling higher output power (which benefits SNR), saving critical power resources, or both.

One way to allow an amplifier to more closely match the performance of an ideal practical amplifier is to use a linearizer. A linearizer is typically utilized in the amplification stages prior to the final HPA, with the objective of attempting to pre-distort the signal in such a way that the signal passing through the linearizer and then the HPA more closely matches the performance of an ideal practical amplifier. The linearizer attempts to provide the inverse of the shape of the HPA amplitude and phase, thereby, yielding a more linear amplifier function. Current generation linearizers, generally devised in the 1990s, provide acceptable performance. However, new satellite applications are moving to signal types that require higher (e.g., ultra-high) linearity and higher power to preserve the fidelity of the signal without excessive back-off. These systems may typically employ higher-order modulation types (e.g., 16APSK, 32APSK . . . 256APSK).

SUMMARY

In some aspects, a high-linearity linearizer system includes a multi-stage linearizer circuit formed by cascading multiple linearizer circuits. The multi-stage linearizer circuit is configured to pre-distort an input signal to generate a pre-distorted signal. A non-linear high-power amplifier (HPA) having non-linear characteristics is coupled to the multi-stage linearizer circuit and is configured to amplify the pre-distorted signal. Pre-distortion characteristics of the multi-stage linearizer circuit is configured to counter the non-linear characteristics of the non-linear HPA and to compensate a non-linearity of the non-linear HPA to achieve a desired level of linearity In other aspects, a method of compensating non-linearity of a non-linear high-power amplifier (HPA) includes providing a multi-stage linearizer circuit by cascading a plurality of linearizer circuits. The multi-stage linearizer circuit is configured to pre-distort an input signal to generate a pre-distorted signal. The non-linear HPA is coupled to the multi-stage linearizer circuit. The non-linear HPA is configured to amplify the pre-distorted signal. The non-linear HPA has non-linear characteristics, and the multi-stage linearizer circuit has pre-distortion characteristics that counter the non-linear characteristics of the non-linear HPA and compensate a non-linearity of the non-linear HPA to achieve a desired level of linearity.

In yet other aspects, a satellite communication system includes a satellite transmit antenna configured to transmit signals to a ground receiver antenna. A non-linear high-power amplifier (HPA) having non-linear characteristics is coupled to the satellite transmit antenna. A multi-stage linearizer circuit is coupled to the non-linear high-power HPA. The multi-stage linearizer circuit is firmed by cascading a plurality of linearizer circuits and is configured to pre-distort an input signal to provide a pre-distorted signal to the non-linear high-power HPA. The non-linear high-power HPA is configured to amplify the pre-distorted signal, and pre-distortion characteristics of the multi-stage linearizer circuit is configured to counter the non-linear characteristics of the non-linear HPA and to compensate a non-linearity of the non-linear HPA to achieve a desired level of linearity.

The foregoing has outlined rather broadly the features of the present disclosure in order that the detailed description that follows can be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific aspects of the disclosure, wherein.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block diagram form in order to avoid obscuring the concepts of the subject technology.

The present disclosure is directed, in part, to methods and configuration for providing a high-linearity multi-stage linearizer. The linearizer of the subject technology improves the linearity of the amplifiers that drive the HPA in communications systems to a level significantly beyond the current state of the art. The subject solution enables advanced applications such as (but limited to) ultra-high definition TV (UHDTV), high-throughput satellites (HTS), ultra-high quality contribution services, and more. Current state of the art linearizers are typically a single-stage linearizer with fixed bias (non-modifiable performance) over the life of the linearizer in the communication system. The subject technology improves linearization of the power amplifier by using a multi-stage linearizer.

Figure 1A:
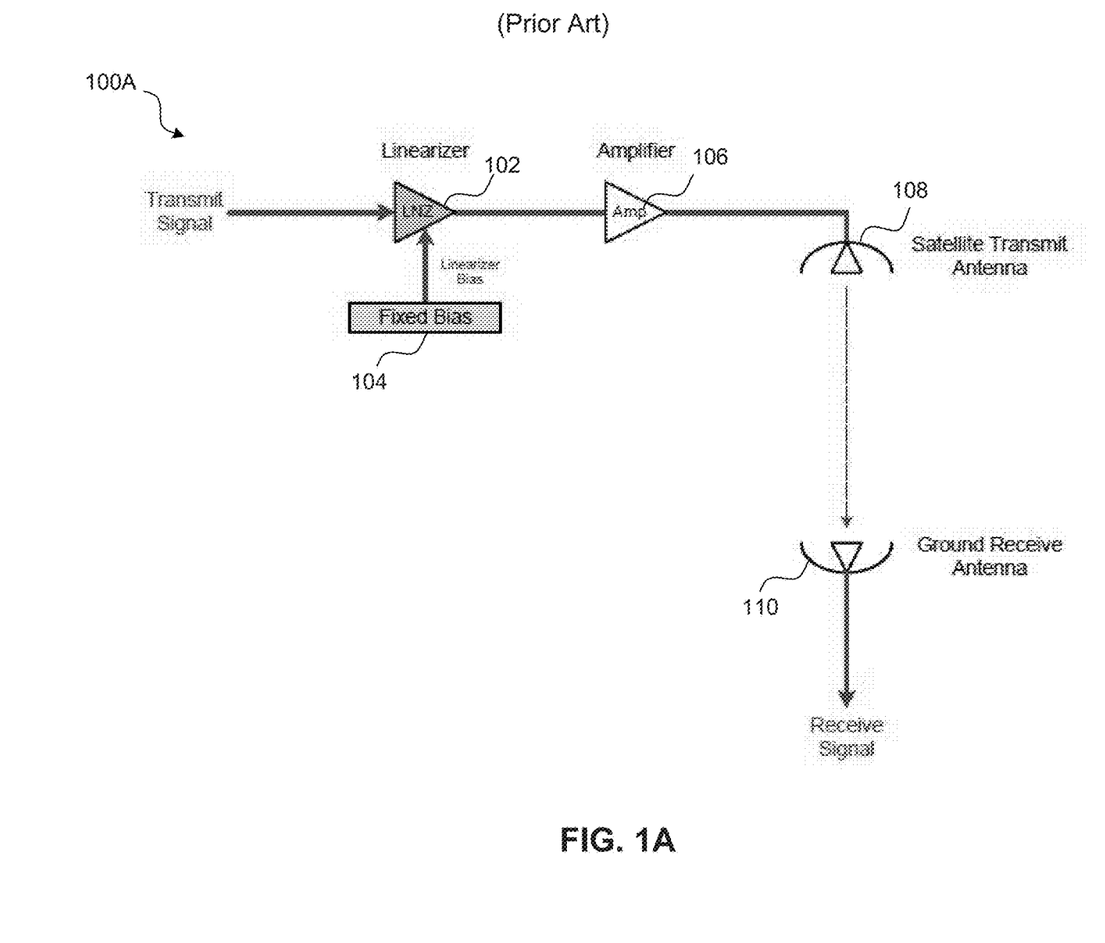
FIG. 1A is a conceptual diagram illustrating an example of a communication system using a single linearizer.
Figure 1B:
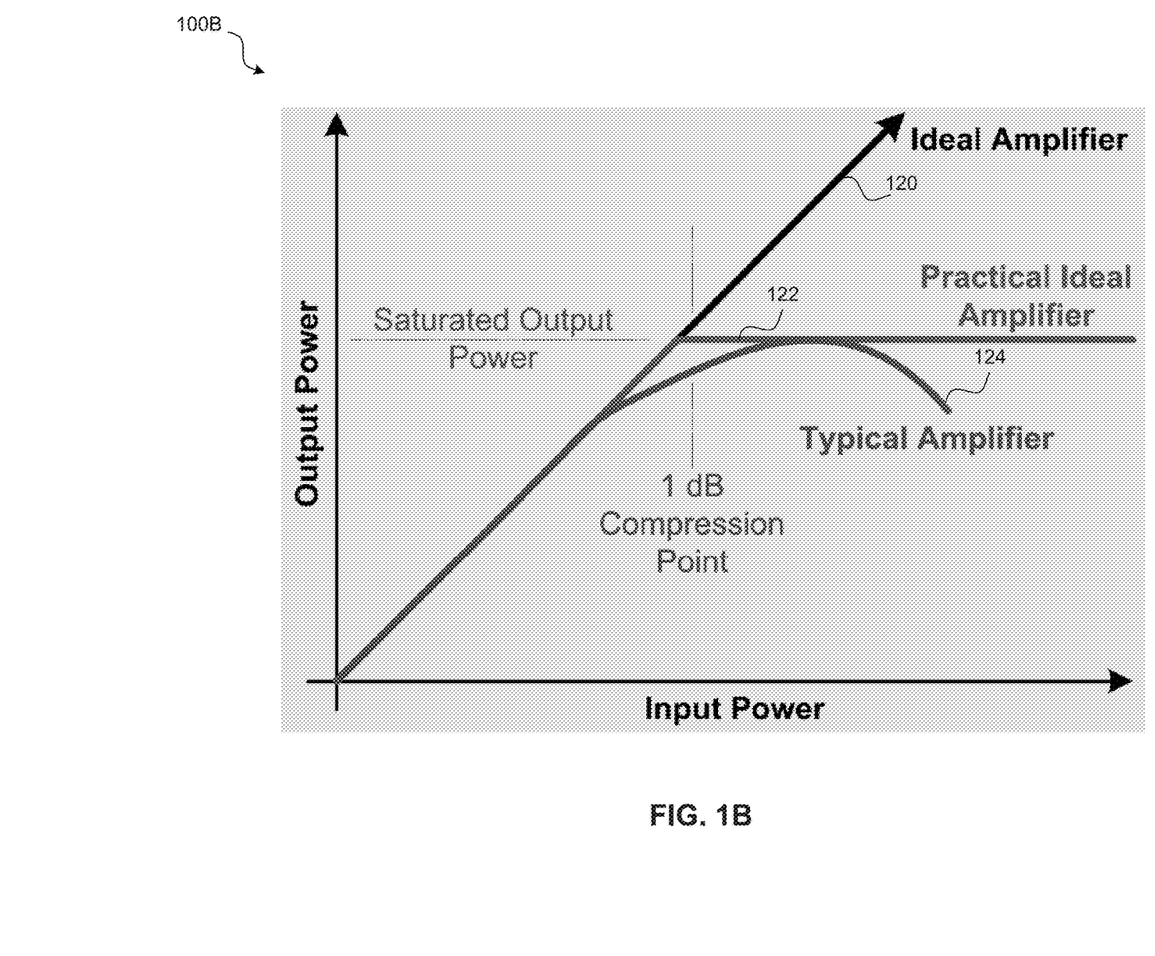
FIG. 1B is a diagram illustrating an example plot of power amplifier transfer functions.

FIG. 1A is a conceptual diagram illustrating an example of a communication system 100A using a single linearizer 102. The communication system 100A includes, but is not limited to, a linearizer 102, a bias circuit 104, a power amplifier 106, a transmit antenna 108 (e.g., a satellite transmit antenna) and a receive antenna 110 (e.g., a ground receive antenna). The input signal (e.g., a transmit signal) to the linearizer 102 is provided by other circuitry including RF driver stages not shown for simplicity. The linearizer 102 pre-distort the transmit signal and provides a pre-distorted signal to the power amplifier 106. The pre-distortion characteristics of the linearizer 102 are desirable if they counter the non-linearity characteristics of the power amplifier such that the non-linearity of the power amplifier is compensated by the pre-distortion characteristics of the linearizer. The bias circuit 104 provides a fixed bias current (or voltage) for the linearizer 102. The fixed bias is designed to enable the linearizer to provide the desired pre-distortion characteristics. However, the ability of a single-stage fixed-bias linearizer compensating the non-linear characteristics of a high-power amplifier is quite limited. The subject technology provides improved pre-distortion characteristics that are capable of compensating the non-linearity of a high-power amplifier and allows using signals with higher-order modulation types (e.g., 16APSK, 32APSK . . . 256APSK). The non-linearity characteristics of power amplifiers and the pre-distortion characteristics of linearizers are explained in more details herein FIG. 1B is a diagram illustrating an example plot 100B of power amplifier transfer functions. The plot 100B includes transfer function 120, 122, and 124 of an ideal power amplifier, a practical power amplifier, and a typical power amplifier, respectively. The transfer function herein is an amplitude transfer function defined as the variation of the output power magnitude versus the input power magnitude (also known an AM-AM response). The transfer function 120 of the ideal power amplifier is a linear function over the entire range of the input power. No practical amplifier has such an ideal characteristics. In a practical amplifier the transfer function 122 saturates at an input power level, after which the output power stays constant. The typical amplifier transfer function 124 is even farther from the ideal transfer function and only follows the ideal behavior up to a certain level of input power and after reaching the saturation level of the practical amplifier transfer function (e.g., 122) may start dropping. The input power level at which the typical amplifier transfer function 124 is deviated from the ideal transfer function 120, by 1-dB of output power, is known as the 1-dB compression point. The objective of the subject technology is to improve linearity of the high-power amplifier (e.g., with higher 1-dB compression point) by providing a multi-stage linearizer.

Figure 1C:
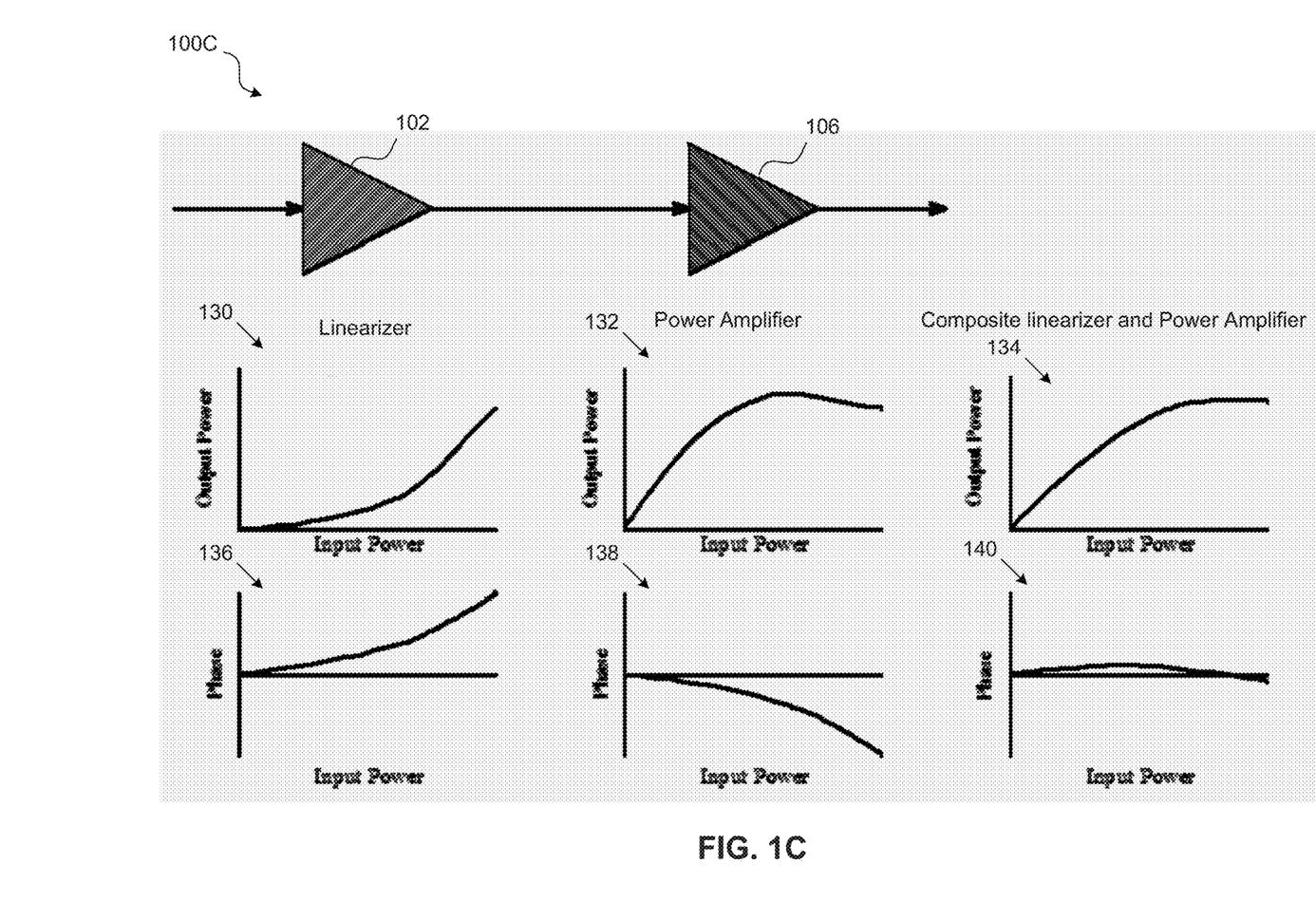
FIG. 1C is a diagram illustrating examples of power amplifier characteristics and linearizer pre-distortion characteristics used in linearization by pre-distortion.

FIG. 1C is a diagram illustrating examples of power amplifier characteristics and linearizer pre-distortion characteristics used in linearization by pre-distortion. A power amplifier 106 is preceded by a linearizer 102 which is used to pre-distort a transmit signal before reaching the power amplifier 106. The non-linearity characteristics of the power amplifier 106 have to be compensated by the countering pre-distortion characteristics of linearizer 102. The non-linearity characteristics of a power amplifier (e.g., 106) includes the amplitude characteristic (e.g., transfer function) 132 (e.g., AM-AM response) and a phase characteristic (e.g., phase response) 138 (also known as AM-PM response) showing variation of a phase of the output power of the power amplifier versus amplitude values of the input power of the power amplifier. The pre-distortion characteristics of the linearizer 102 also include a pre-distortion amplitude characteristic (e.g. transfer function) 130 and a pre-distortion phase characteristic (e.g., phase response) 136.

The composite effect of the linearizer 102 and the power amplifier 106 can be obtained by combining the predistortion characteristics 130 and 136 of the linearizer 102 with the non-linearity characteristics 132 and 138 of the power amplifier 106. The combination can be achieved by multiplying the amplitude transfer function 132 by the pre-distortion amplitude characteristic 130, and by adding the phase responses 138 and 136. The resulting amplitude and phase characteristics 134 and 140 are shown to approach characteristics of a practical power amplifier. The phase characteristic of a practical amplifier deviates from zero by a small value at sonic input power levels and is zero at some other input power levels. In ideal conditions, the pre-distortion amplifier characteristic 130 of the linearizer 102 needs to be an inverse of the transfer function 132 of the power amplifier 106 and a pre-distortion phase response 136 of the linearizer 102 needs to oppose (e.g., have the same amplitude but opposite sign) the phase response 138 of the power amplifier 106. In a practical situation, however, the above ideal conditions can only be achieved in a limited range of the input power and the improvement of the linearization extends that limited range to higher values of input power, as further described herein.

Figure 2A:
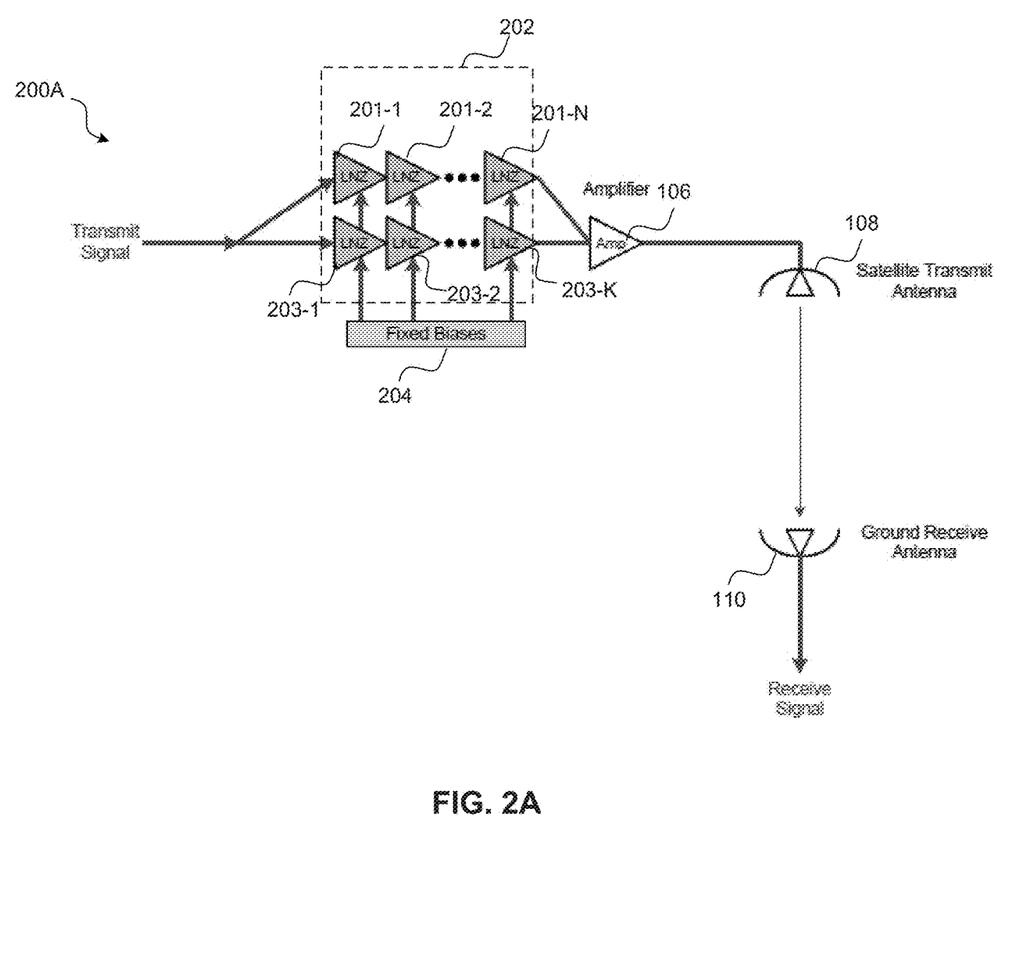
FIG. 2A is a diagram illustrating an example of a communication system using a multi-stage linearizer, according to certain aspects.

FIG. 2A is a diagram illustrating an example of a communication system 200A using a multi-stage linearizer 202, according to certain aspects. The communication system 200A is similar to the communication system 100A of FIG. 1A, except for a multi-stage linearizer 202 that is replacing the single-stage linearizer circuit 102 of FIG. 1A. The multi-stage linearizer 202 can be formed by series combination, parallel combination, or series and parallel combinations of a number of linearizer circuits. For example, in the multi-stage linearizer 202, two parallel branches of linearizer circuits are formed by cascading linearizer circuits 201 (e.g., 201-1, 201-2 . . . 201-N) and 203 (e.g., 203-1, 203-2 . . . 203-K) in two parallel branches. In one or more implementations, N and K may be the same or different integer numbers and the number of branches may be more than two M, such as three or four).

The multi-stage linearizer 202 allows improved linearization of the power amplifier 106 by providing a higher number of degrees of freedom. In some implementations, the cascaded linearizer circuits 201 and 203 can have similar or different pre-distortion characteristics. For example, the cascaded linearizer circuits 201 may be similar but have different pre-distortion characteristics than one or more of the linearizer circuits 203. The effect of the series and parallel combinations of the cascaded linearizer circuits 201 and 203 can be analyzed by a curve fitting approach. This approach allows determination of a configuration of the series and parallel combinations that achieves a desired level of linearity. The configuration of the series and parallel combinations is defined by a first count (e.g., N or K) of the one or more linearizer circuits in each branch and a second count (e.g., M) of the two or more branches. The desired level of linearity is defined by an R-squared ($R^2$) value (e.g., 0.995) of the curve fit as described in more detail herein. The $R^2$ value is also known from the field of statistics as a coefficient of determination, wherein a larger value (with a maximum value of 1.0) indicates that a modelled behavior is more explained by the parameters in the model.

Figure 2B:
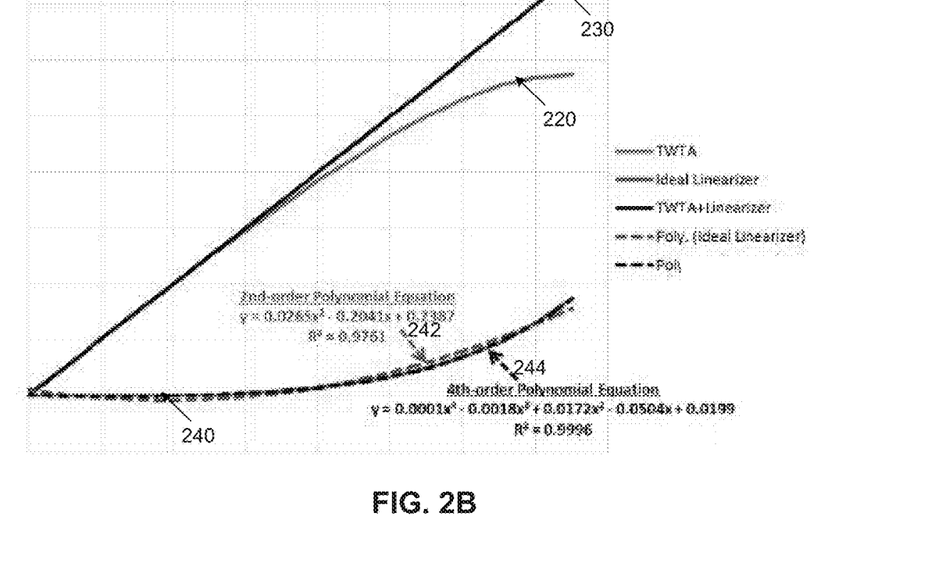
FIGS. 2B-2C are diagrams illustrating an example of a multi-stage linearization curve fitting, according to certain aspects.
Figure 2C:
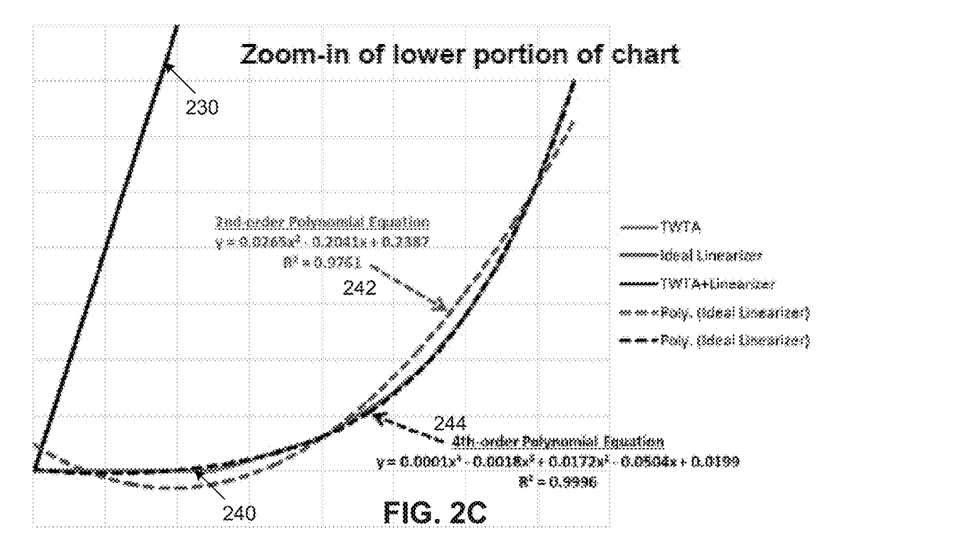

FIGS. 2B-2C are diagrams illustrating an example of a multi-stage linearization curve fitting, according to certain aspects. The multi-stage linearizer operating principle is best described by the principle of fitting a polynomial equation of arbitrary order to a performance curve in order to approximate the desired end-to-end characteristic performance. The curves that are being fit are the pre-distortion characteristic curves (e.g., 130 and 136 of FIG. 1C) of the linearizer (e.g., the multi-stage linearizer 202 of FIG. 2A) that are desired to be exactly opposite (e.g., in an ideal situation) of the non-linearity characteristics (e.g., amplitude and phase characteristics) of the power amplifier, as described above. The diagram of FIG. 2B illustrates how a multi-stage linearizer can improve linearity of a typical characteristic (e.g., amplitude and phase) of a power amplifier (e.g., a travelling wave tube amplifier (TWTA) of a satellite communication system). A curve 220 shows the nonlinear amplitude characteristics of the power amplifier (e.g., TWTA). The curve 230 is the result of combination of the amplitude characteristic of the power amplifier and a pre-distortion amplitude characteristic of a multi-stage linearizer (e.g., 202). The ideal practical pre-distortion would yield a cascaded performance that exactly matches performance of to the practical amplifier, as shown in FIG. 1B.

When multiple linearizers are combined to form a multi-stage linearizer (e.g., 202), a higher number of degrees of freedom can be achieved that allows the cascaded multi-stage linearizer to implement a higher-order polynomial fit to the non-linear amplifier characteristics. As the polynomial order of the curve fit is increased, it can better match the shape it has to achieve to realize the ideal practical amplifier performance for the cascade of the linearizer and the amplifier. One can envision that a single linearizer provides a certain order (e.g., N) of curve fitting to the non-linear amplifier amplitude and phase performance, where N represents the degrees of freedom in the polynomial fit, if the amplifier performance demands a higher-order curve fit, then a single linearizer would only be able to approximate the required fit. In order to extract more performance and more closely match the ideal or ultra-high linearity performance, multiple linearizers are cascaded to achieve a higher order (2N, 3N, . . . ), which results in a quantitatively significant increase in linearity for the linearizer and amplifier cascaded pair. The curves 240, 242, and 244 correspond to a $2^{nd}$ order linearizer, an ideal linearizer, and a $4^{th}$ order linearizer, respectively. The diagram of FIG. 2C is a zoom-in view of the diagram of FIG. 2B. As shown in FIG. 2C, the $4^{th}$ order linearizer (e.g., curve 244) has a better fit to the ideal linearizer (curve 240) than the $2^{nd}$ order linearizer (e.g., curve 242). The better fit is indicated by a higher $R^2$ value for the $4^{th}$ order linearizer. In some implementations, the $R^2$ value can be an indicator of the desired level of linearity of the linearized power amplifier.

Figure 3A:
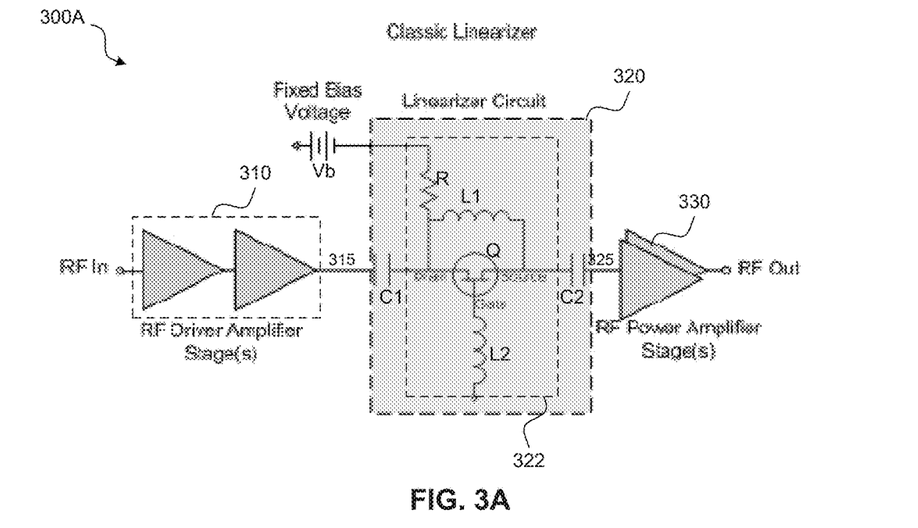
FIGS. 3A-3B are diagrams illustrating examples of a single linearization block and a multi-stage linearization block used in a transmit path, according to certain aspects.
Figure 3B:
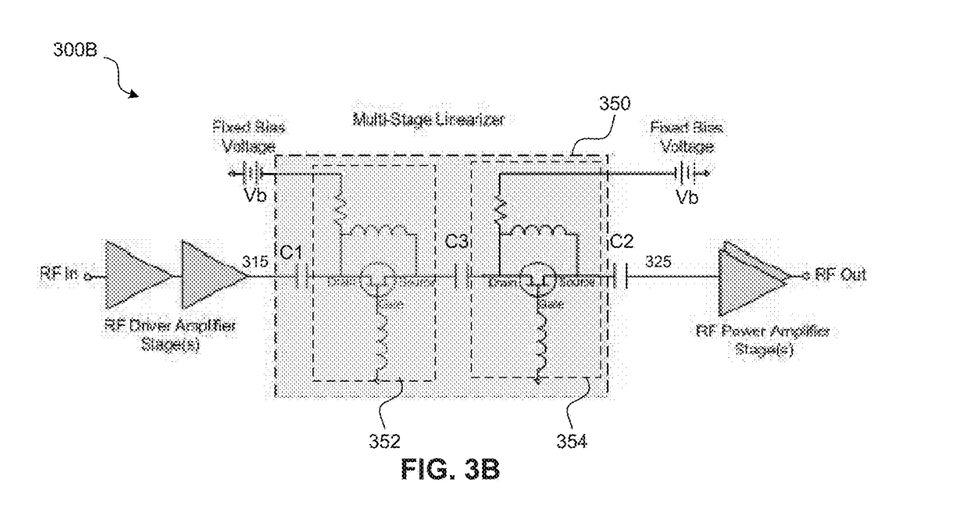

FIGS. 3A-3B are diagrams illustrating examples of a single linearization block 320 and a multi-stage linearization block 350 used in transmit paths 300A and 300B, according to certain aspects. A transmit path 300A of FIG. 3A includes a radio-frequency (RF) driver amplifier stage (s) 310, the single linearization block 320, and an RF power amplifier stage(s) 330. The description of the RF driver amplifier stage (s) 310 and RF power amplifier stage(s) 330 are known and are skipped here for brevity. The single linearization block 320 includes coupling capacitors C1 and C2 and the linearizer circuit 322 including a transistor (e.g., a field effect transistor (FET)) Q, a resistor R, and inductors L1 and L2. The transistor Q is biased in such a way that the drain to source path is a series connection, from an input 315 to an output 325 of the linearizer circuit 322. As the gate-to-source bias potential of the transistor Q is adjusted, the impedance of the drain-to-source connection varies according to the transconductance of the transistor Q. The bias voltage Vb is applied in such a way that the voltage drop from drain-to-source of the transistor Q remains at 0V, while the voltage drop from gate-to-source of the transistor Q becomes more negative with increased bias voltage Vb. With this configuration, as the RF input signal increases, the insertion loss of the linearizer circuit 322 decreases. The value of components (e.g., R, L1, and L2) in the linearizer circuit 322 and the bias voltage Vb are optimized in order to make the AM-AM and AM-PM responses of the linearizer circuit 322 counter the respective AM-AM and AM-PM responses of the RF power amplifier stage(s) 330. The single linearizer circuit 322, however, can be optimized only for a very narrow window of RF power. The subject technology addresses this shortcoming by using a multi-stage linearizer, as described below.

FIG. 3B shows the transmit path 300B including the multi-stage linearizer block 350. The transmit path 300B is similar to the transmit path 300A except for the multi-stage linearizer block 350 that replaces the single linearization block 330 of FIG. 3A. The multi-stage linearizer block 350 includes coupling capacitors C1, C2, and C3, and the cascaded linearizer circuits 352 and 354. In this example, only two linearizer circuits are connected in series. In some implementations, the multi-stage linearizer block 350 can include more linearizer circuits (e.g., similar to or different from the linearizer circuit 322) coupled to one another in series or parallel or series and parallel combinations (e.g., similar to 202 of FIG. 2A). A multi-stage linearizer configuration (e.g., 350) addresses the limitation of the single linearizer (e.g., 320 FIG. 3A) by adding a second linearizer stage, or any number of stages. The more ideal the match is between the pre-distortion of the linearizer circuit and the power amplifier, the wider the RF output power dynamic range between the pair is.

In one or more implementations, the number of linearizer stages may be determined by the non-linearity characteristics of the power amplifier (PA) to be linearized and the desired level of linearity. Linearizers are tuned by taking the measured AM-AM and AM-PM response of the PA and adjusting the linearizer bias, the linearizer RF input drive level, and the PA input drive level, until various figures of merit (dependent on the requirements) are met. In a multi-stage linearizer, there can be 3*n more variables, where n is the number of linearizer stages. A typical linearizer is set to a compromise set of bias points within the circuitry that provides acceptable linearization performance over a wide range of operating conditions, such as the amplifier input power back-off and signal frequency. This linearity performance is typically characterized by the parameters such as carrier-to-$3^{rd}$-order intermodulation power ratio (C/3IM) or noise power ratio (NPR).

Figure 4:
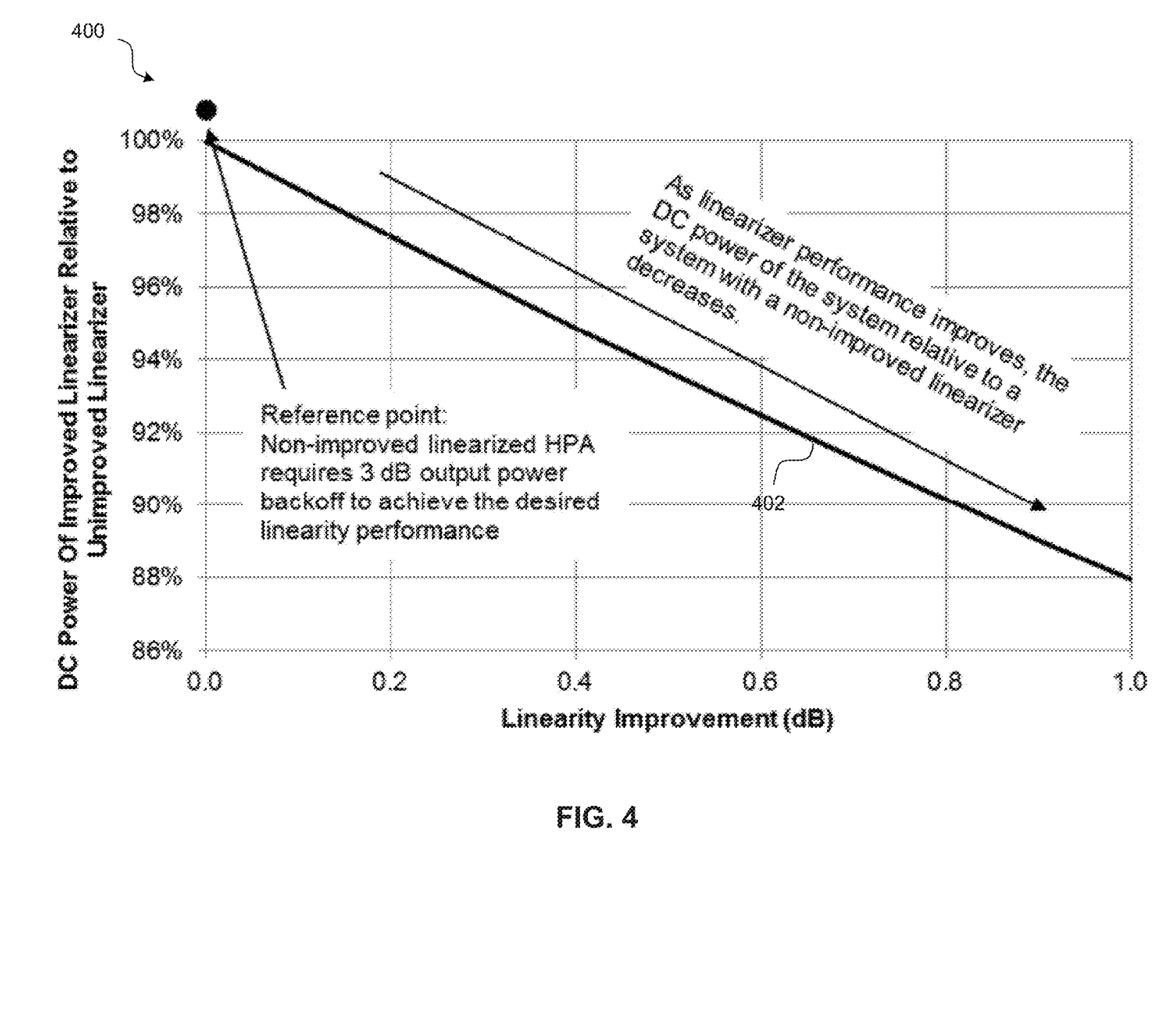
FIG. 4 is a diagram illustrating an example plot showing DC power saving of a high-power amplifier with improved linearization, according to certain aspects.

FIG. 4 is a diagram illustrating an example plot 400 showing DC power saving of a high-power amplifier with improved linearization, according to certain aspects. The plot 400 shows DC power level of a high-power amplifier versus linearity improvement (dB). The DC power level shown in percentile is relative to a DC high-power amplifier linearized with an unimproved linearizer that requires 3 dB output back-off. The relative DC power of the power amplifier is seen to decrease as the linearizer performance improves (e.g., by using a multi-stage linearizer). For a typical satellite that may operate 68 power amplifiers (e.g., TWTAs) at 3 dB or more output back-off with a payload DC power of 14000 W, a 0.4 dB increase in linearity, which allows 0.4 dB less output power back-off, could result in a 5% reduction in payload power, or 280 W. This reduction in DC power provides a corresponding decrease in the cost of the various subsystems that support the payload, including the electrical power subsystem (batteries, solar array). Other advantageous features of the subject technology are described below.

Figure 5:
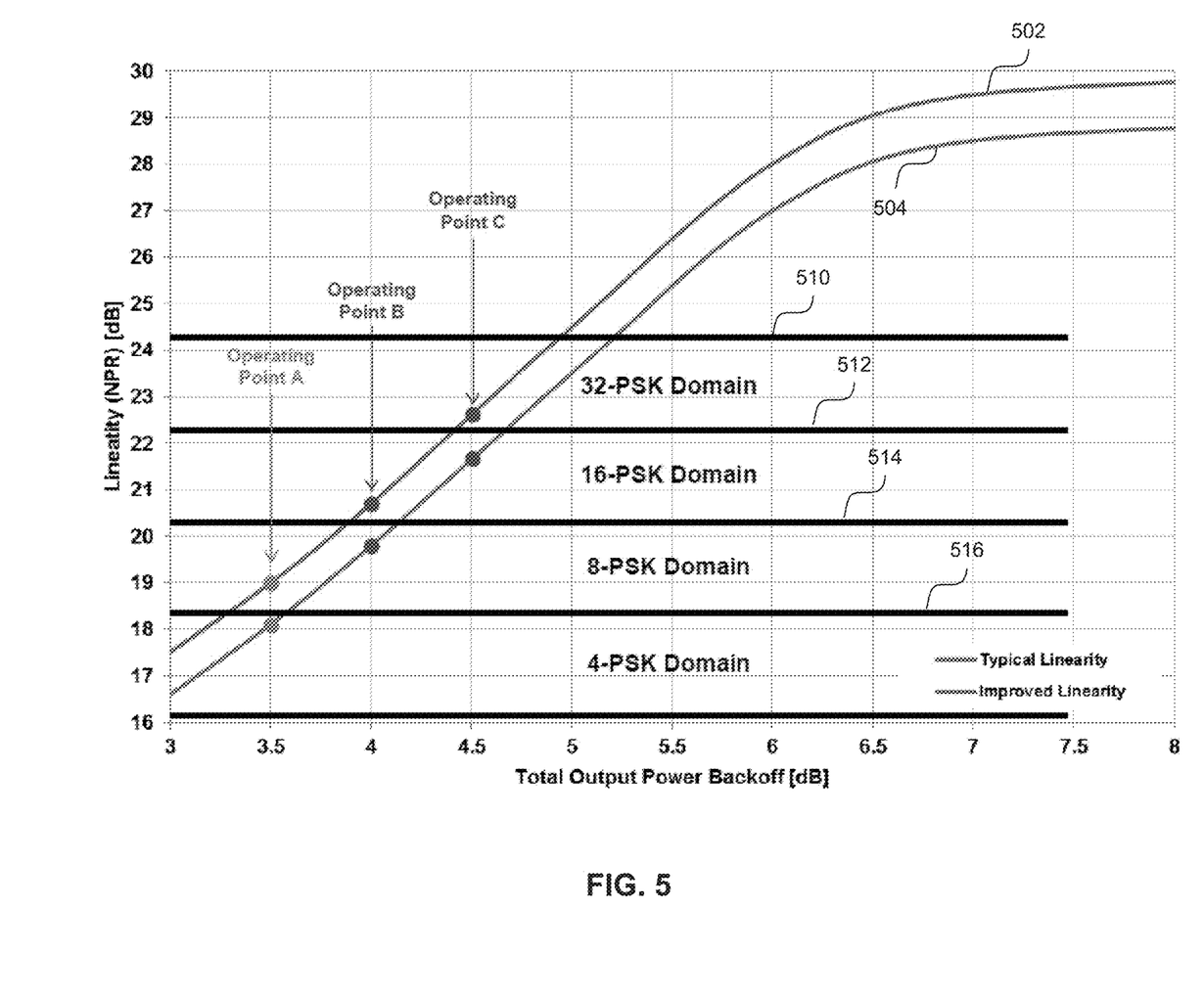
FIG. 5 is a diagram illustrating example plots showing ability to use higher order modulation with improved linearization of a power amplifier, according to certain aspects.

FIG. 5 is a diagram illustrating example plots 502 and 504 showing ability to use higher order modulation with improved linearization of a power amplifier, according to certain aspects. The plots 502 and 504 show the linearity (characterized by NPR (in dB)) versus total power back-off for a power amplifier with an improved linearizer (e.g., multi-stage linearizer) and a power amplifier with a typical linearizer, respectively. The horizontal lines 510, 512, 514, and 516 divide the plane of the plot into a number of domains such as 32-PSK, 16-PSK, 8PSK, and 4-PSK modulation domains. For example, the 16-PSK domain shows a region of the plot where a linearized power amplifier operating in that region can be used in an RF transmitter applying the 16-PSK modulation scheme. In other words, the higher order modulation schemes are more demanding on the linearity of the power amplifier. The operating points A, B, and C correspond to three levels of total power back-off (e.g., ~3.5 dB, ~4 dB, and ~4.5 dB). For the three operating points, the power amplifier with an improved linearizer (e.g., of plot 502) are capable of supporting a higher order modulation scheme. For instance, at operating point B, the power amplifier with the typical linearity (plot 504) can only support 8-PSK modulation scheme, whereas the power amplifier with the improved linearity (plot 502) can support 16-PSK modulation scheme, which provides higher fidelity.

The results shown by the plots 502 and 504 further indicate that at some particular back-off point, an improved linearizer may provide better linearity for a specific type of signal being carried through the linearizer. This improved linearity may be a key enabler for allowing signals that are highly susceptible to linearity degradations (such as higher-order modulations types, such as 32-PSK) to operate with adequate link margin in a reasonably-sized satellite system. The higher order modulation enabled by the linearity-improved system allows more information throughput through the system compared to an un-improved system at the same amplifier back-off point because the spectral efficiency (bps/symbol or bps/Hz) is increased. In this case, the DC power resources used for the system may be approximately the same as the system with the un-improved linearizer, but more throughput is achieved, increasing the bits-per-second/Hz$, a key benchmark for high-throughput satellite systems. The higher-order modulations would have higher spectral efficiency and therefore higher throughput or capacity, which translates into higher revenue for the operator. For example, the spectral efficiency could increase from QPSK-3/4r coding with a spectral efficiency of 1.45 bps/symbol to 8-PSK-3/4r coding with a spectral efficiency of 2.18 bps/symbol, for a ~50% increase in capacity.

Figure 6:
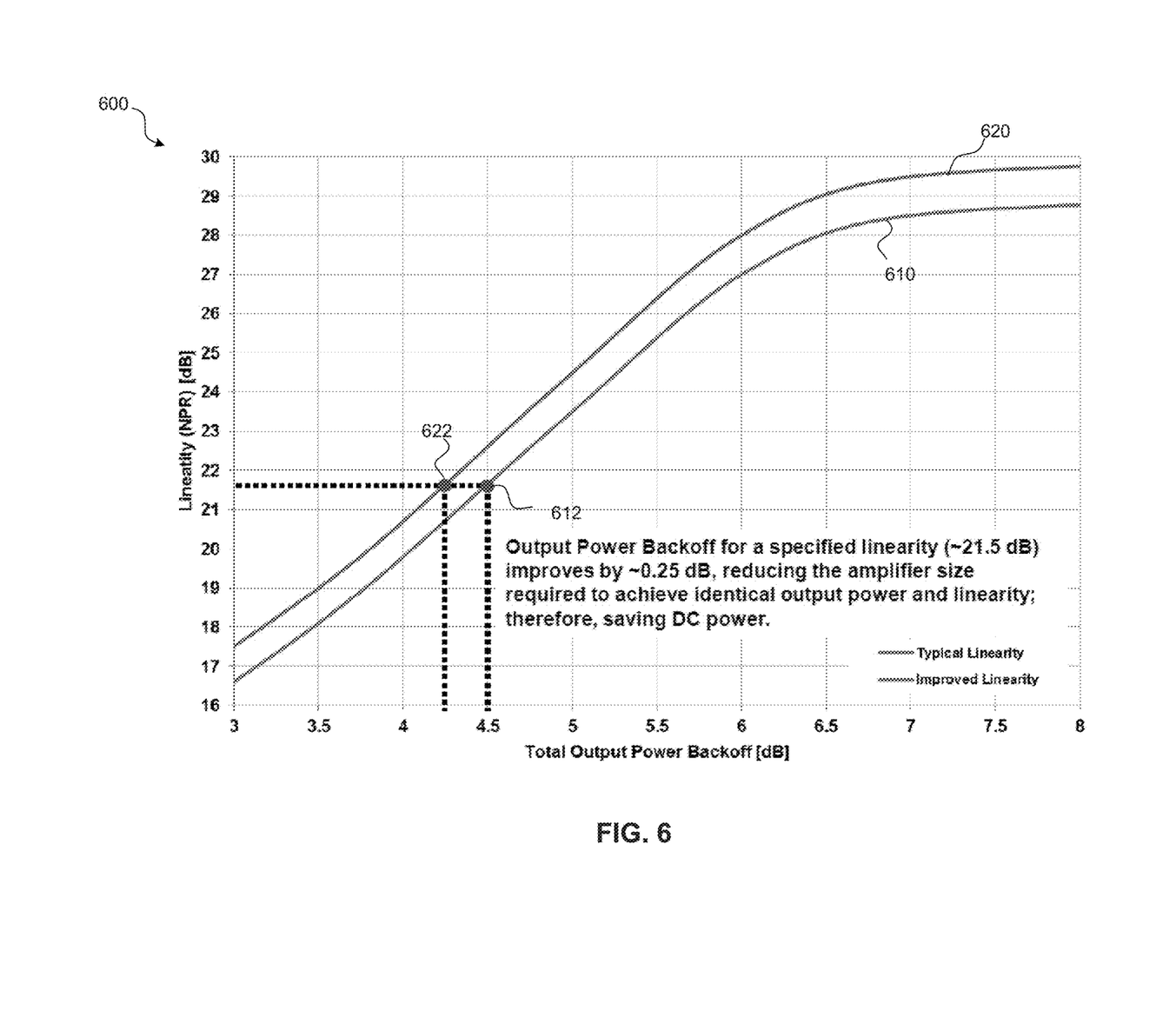
FIG. 6 is a diagram illustrating example plots showing ability to use less DC power with improved linearization of a power amplifier, according to certain aspects.

FIG. 6 is a diagram illustrating example plots 602 and 604 showing ability to use less DC power with improved linearization of a power amplifier, according to certain aspects. The plots 602 and 604 are similar to the plots 502 and 504 of FIG. 5, except that they are used to indicate power back-off reduction as a result of linearity improvement. For example, at a specific level of linearity (e.g., ~21.5 dB) a typical linearity PA operates at point 612 on the plot 610, which corresponds to ~4.5 dB power back-off, whereas at the same level of linearity, a linearity-improved PA operates at a point 622 on the plot 620, which corresponds to ~0.25 dB lower (e.g., at 4.25 dB) power back-off. In other words, a better linearity may be achieved at a specific operating point, but, if the system does not require improved linearity for the signal traffic type it is carrying, the improvement could be used to reduce the required DC power for the amplifier and the system as a whole.

Figure 7:
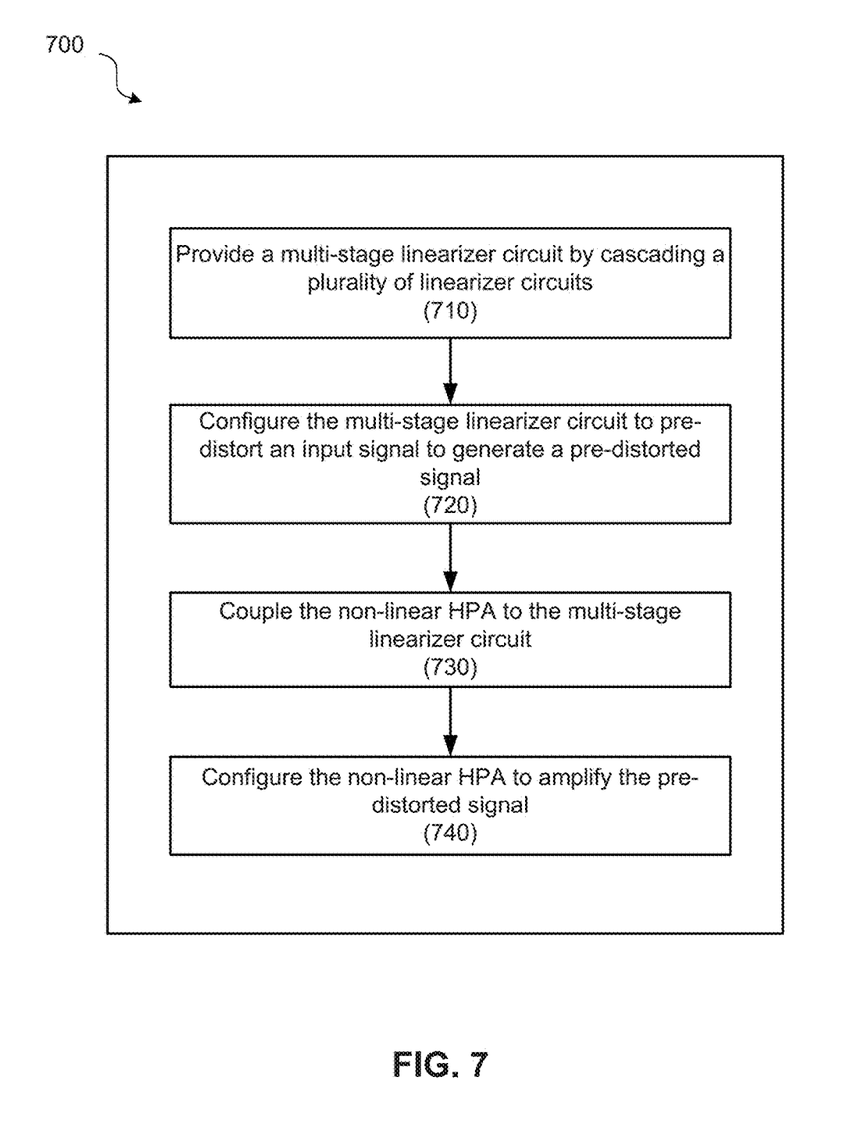
FIG. 7 is a flow diagram illustrating an example of a method for compensating non-linearity of a non-linear high-power amplifier, according to certain aspects.

FIG. 7 is a flow diagram illustrating an example of a method 700 for compensating non-linearity of a non-linear high-power amplifier, according to certain aspects. The method 700 includes providing a multi-stage linearizer circuit (e.g., 202 of FIG. 2A) by cascading a plurality of linearizer circuits (e.g., 201 or 203 of FIG. 2A) (710). The multi-stage linearizer circuit is configured to pre-distort an input signal (e.g., as seen from 130 of FIG. 1C) to generate a pre-distorted signal (720). The non-linear HPA (e.g., 106 of FIG. 2A) is coupled to the multi-stage linearizer circuit (730). The non-linear HPA is configured to amplify the pre-distorted signal (740). The non-linear HPA has non-linear characteristics (e.g., similar to 132 and 138 of FIG. 1C), and the multi-stage linearizer circuit has pre-distortion characteristics (e.g., similar to 130 and 136 of FIG. 1C) that counter the non-linear characteristics of the non-linear HPA and compensate a non-linearity of the non-linear HPA to achieve a desired level of linearity (e.g., similar to 134 and 140 of FIG. 1C).

Figure 8:
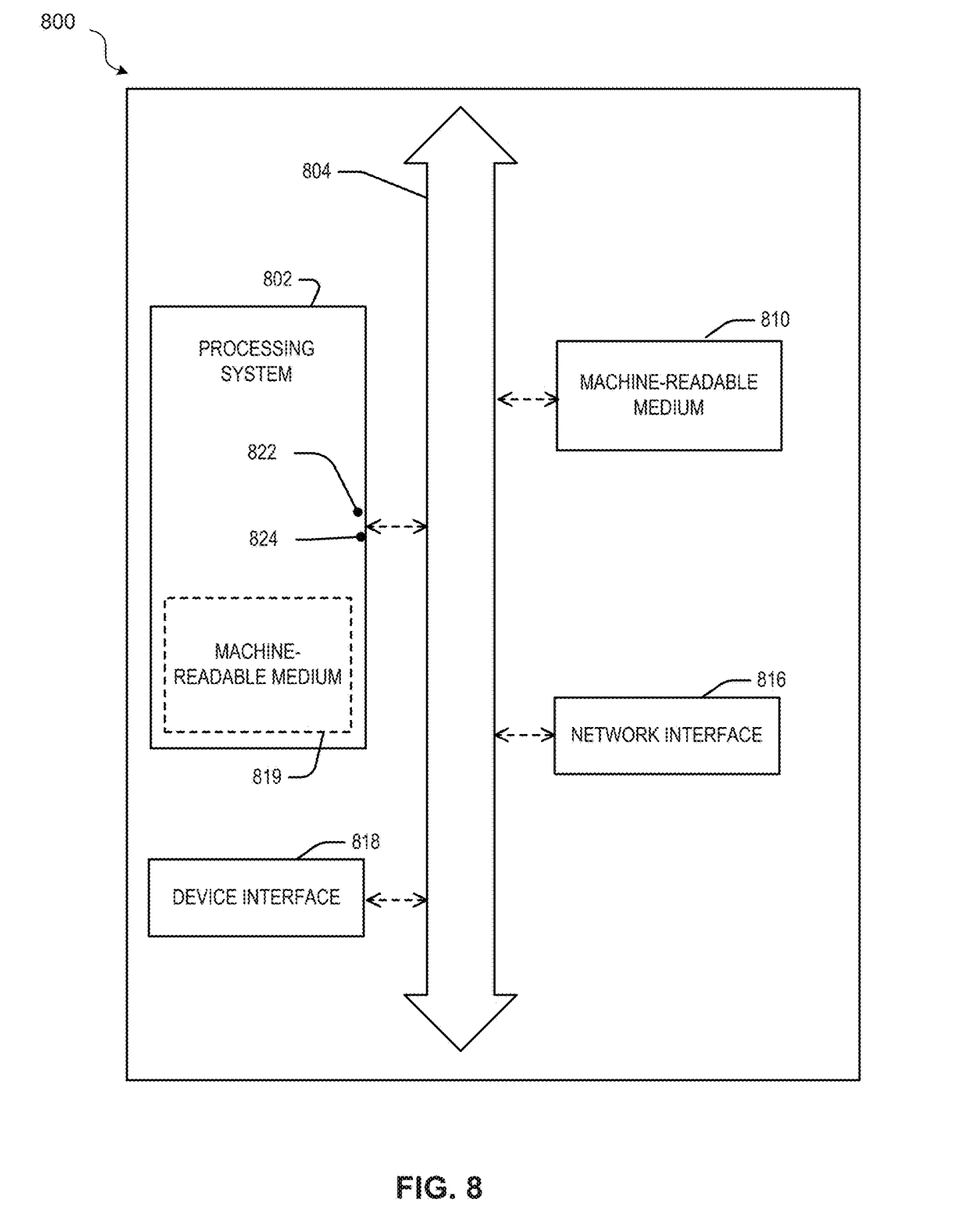
FIG. 8 is a diagram illustrating an example of a system for implementing some aspects of the subject technology

FIG. 8 is a diagram illustrating an example of a system 800 for implementing some aspects of the subject technology. The system 800, for example, may be a computer system that is used to analyze and/or simulate the multi-stage linearizer of the subject technology, for example, to determine an optimized configuration of the multi-stage linearizer (e.g., 202 of FIG. 2A). The system 800 includes a processing system 802, which may include one or more processors or one or more processing systems. A processor can be one or more processors. The processing system 802 may include a general-purpose processor or a specific-purpose processor for executing instructions and may further include a machine-readable medium 819, such as a volatile or non-volatile memory, for storing data and/or instructions for software programs. The instructions, which may be stored in a machine-readable medium 810 and/or 819, may be executed by the processing system 802 to control and manage access to the various networks, as well as provide other communication and processing functions. The instructions may also include instructions executed by the processing system 802 for various user interface devices, such as a display 812 and a keypad 814. The processing system 802 may include an input port 822 and an output port 824. Each of the input port 822 and the output port 824 may include one or more ports. The input port 822 and the output port 824 may be the same port (e.g., a bi-directional port) or may be different ports.

The processing system 802 may be implemented using software, hardware, or a combination of both. By way of example, the processing system 802 may be implemented with one or more processors. A processor may be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable device that can perform calculations or other manipulations of information.

A machine-readable medium can be one or more machine-readable media. Software shall be construed broadly to mean instructions, data, or any combination thereof, whether referred to as software, firmware, middleware, microcode, hardware description language, or otherwise. Instructions may include code (e.g., in source code format, binary code format, executable code format, or any other suitable format of code).

Machine-readable media (e.g., 819) may include storage integrated into a processing system such as might be the case with an ASIC. Machine-readable media (e.g., 810) may also include storage external to a processing system, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device. Those skilled in the art recognizes how best to implement the described functionality for the processing system 802. According to one aspect of the disclosure, a machine-readable medium is a computer-readable medium encoded or stored with instructions and is a computing element, which defines structural and functional interrelationships between the instructions and the rest of the system, which permit the instructions' functionality to be realized. Instructions may be executable, for example, by the processing system 802 or one or more processors. Instructions can be, for example, a computer program including code for performing methods of the subject technology.

A network interface 816 may be any type of interface to a network (e.g., an Internet network interface), and may reside between any of the components shown in FIG. 8 and coupled to the processor via the bus 804.

A device interface 818 may be any type of interface to a device and may reside between any of the components shown in FIG. 8. A device interface 818 may, for example, be an interface to an external device that plugs into a port (e.g., USB port) of the system 800.

The description of the subject technology is provided to enable any person skilled in the art to practice the various aspects described herein. While the subject technology has been particularly described with reference to the various figures and aspects, it should be understood that these are for illustration purposes only and should not be taken as limiting the scope of the subject technology.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various aspects described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

Although the invention has been described with reference to the disclosed aspects, one having ordinary skill in the art will readily appreciate that these aspects are only illustrative of the invention. It should be understood that various modifications can be made without departing from the spirit of the invention. The particular aspects disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative aspects disclosed above may be altered, combined, or modified and all such variations are considered within the scope and spirit of the present invention. While compositions and methods are described in terms of "comprising," "containing," or "including" various components or steps, the compositions and methods can also "consist essentially of" or "consist of" the various components and operations. All numbers and ranges disclosed above can vary by some amount. Whenever a numerical range with a lower limit and an upper limit is disclosed, any number and any subrange falling within the broader range are specifically disclosed. Also, the terms in the claims have their plain, ordinary meaning unless otherwise explicitly and clearly defined by the patentee. If there is any conflict in the usages of a word or term in this specification and one or more patent or other documents that may be incorporated herein by reference, the definitions that are consistent with this specification should be adopted.

What is claimed is:

1. A high-linearity linearizer system, the system comprising:
    a multi-stage linearizer circuit formed by cascading a plurality of linearizer circuits and configured to pre-distort an input signal to generate a pre-distorted signal;
    a non-linear high-power amplifier (HPA) having non-linear characteristics coupled to the multi-stage linearizer circuit and configured to amplify the pre-distorted signal; and
    a processor configured to use a curve fitting approach to analyze an effect of coupling the plurality of linearizer circuits in series and parallel combinations on a desired level of linearity, and to determine a configuration of the series and parallel combinations that achieves the desired level of linearity,
    wherein pre-distortion characteristics of the multi-stage linearizer circuit provide for countering the non-linear characteristics of the non-linear HPA and compensating a non-linearity of the non-linear HPA to achieve the desired level of linearity.

2. The system of claim 1, wherein the nonlinear characteristics comprise nonlinear amplitude and phase characteristics, wherein the pre-distortion characteristics comprise predistortion amplitude and phase characteristics, and wherein each of the series combinations is formed by coupling some of the plurality of linearizer circuits in series.

3. The system of claim 1, wherein each parallel combination is formed by coupling some of the plurality of linearizer circuits in parallel.

4. The system of claim 1, wherein the series and parallel combinations are formed by coupling the plurality of linearizer circuits to one another in series and parallel.

5. The system of claim 4, wherein each of the series combinations comprises a branch formed by two or more linearizer circuits coupled in series, and wherein the parallel combination is forming by coupling two or more branches in parallel.

6. The system of claim 5, wherein the desired level of linearity is defined by an R-squared value, and wherein the configuration of the series and parallel combinations is defined by a first count of the two or more linearizer circuits in each branch and a second count of the two or more branches.

7. The system of claim 1, wherein a gate node of the FET is coupled via a second inductor to ground potential.

8. The system of claim 1, wherein at least some of the plurality of linearizer circuits comprise analog linearizers comprising a field effect transistor (FET), and wherein a source node of the FET is coupled to the drain node of FET via a first inductor.

9. A method of compensating non-linearity of a non-linear high-power amplifier (HPA), the method comprising:
    providing a multi-stage linearizer circuit by cascading a plurality of linearizer circuits;
    configuring the multi-stage linearizer circuit to pre-distort an input signal to generate a pre-distorted signal;
    coupling the non-linear HPA to the multi-stage linearizer circuit;
    configuring the non-linear HPA to amplify the pre-distorted signal; and
    using a curve fitting approach to analyze an effect of the series and parallel combinations on the desired level of linearity and determining a configuration of the series and parallel combinations that achieves the desired level of linearity,
    wherein the non-linear HPA has non-linear characteristics, and the multi-stage linearizer circuit has pre-distortion characteristics to counter the non-linear characteristics of the non-linear HPA and to compensate a non-linearity of the non-linear HPA to achieve the desired level of linearity.

10. The method of claim 9 further comprises forming each of the series combinations by coupling some of the plurality of linearizer circuits in series, wherein the nonlinear characteristics comprise nonlinear amplitude and phase characteristics, and wherein the predistortion characteristics comprises predistortion amplitude and phase characteristics.

11. The method of claim 9 further comprises forming each parallel combination by coupling some of the plurality of linearizer circuits in parallel.

12. The method of claim 9 further comprises forming the series and parallel combinations by coupling some of the plurality of linearizer circuits to one another in series and parallel.

13. The method of claim 12, wherein each of the series combinations comprises a branch and the method further comprises forming the branch by coupling two or more linearizer circuits in series, and forming the parallel combination by coupling two or more branches in parallel.

14. The method of claim 13, further comprising determining the desired level of linearity by determining an R-squared value, and determining the configuration of the series and parallel combinations based on a first count of the two or more linearizer circuits in each branch and a second count of the two or more branches.

15. The method of claim 9, wherein the method further comprises coupling a gate node of the FET via a second inductor to ground potential.

16. The method of claim 9, wherein at least some of the plurality of linearizer circuits comprise analog linearizers comprising a field effect transistor (FET), and wherein a source node of the FET is coupled to the drain node of FET via a first inductor.

17. A satellite communication system comprising:
    a satellite transmit antenna configured to transmit signals to a ground receiver antenna;
    a non-linear high-power amplifier (HPA), having non-linear characteristics, coupled to the satellite transmit antenna;
    a multi-stage linearizer circuit coupled to the non-linear high-power HPA, the multi-stage linearizer circuit being formed by cascading a plurality of linearizer circuits and being configured to pre-distort an input signal to provide a pre-distorted signal to the non-linear high-power HPA; and
    a processor configured to use a curve fitting approach to analyze an effect of coupling the plurality of linearizer circuits in series and parallel combinations on a desired level of linearity, and to determine a configuration of the series and parallel combinations that achieves the desired level of linearity, wherein at least some of the plurality of linearizer circuits comprise analog linearizers comprising a field effect transistor (FET), wherein the non-linear high-power HPA is configured to amplify the pre-distorted signal, and pre-distortion characteristics of the multi-stage linearizer circuit are configured to achieve the desired level of linearity.

18. The satellite system of claim 17, wherein the nonlinear characteristics comprises nonlinear amplitude and phase characteristics, wherein the predistortion characteristic comprises predistortion amplitude and phase characteristics.

\* \* \* \* \*